United States Patent [19]
Grady et al.

[11] Patent Number: 5,886,429
[45] Date of Patent: Mar. 23, 1999

[54] VOLTAGE SAG/SWELL TESTING STATION

[75] Inventors: W. Mack Grady, Round Rock; Ricardo Chan, Carrollton, both of Tex.; Gregorio C-Y Chung, Panama City, Panama; David Gerez, Bozeman, Mont.; William Blane Leuschner, Smyrna, Tenn.; George P. Olson, Chesapeake, Va.

[73] Assignee: Board of Regents, The University of Texas System, Austin, Tex.

[21] Appl. No.: 989,192

[22] Filed: Dec. 11, 1997

[51] Int. Cl.[6] .................................................. G01R 19/165
[52] U.S. Cl. ........................ 307/125; 307/106; 324/102; 324/522; 324/527; 327/2
[58] Field of Search ..................................... 307/125, 106; 324/72, 102, 76.24, 522, 527, 535; 327/2

[56] References Cited

U.S. PATENT DOCUMENTS

| | | | |
|---|---|---|---|
| 3,569,829 | 3/1971 | Griffey | 324/72 |
| 4,006,413 | 2/1977 | Silberberg | 324/102 |
| 4,031,464 | 6/1977 | Norberg | 324/76.74 |
| 4,206,413 | 6/1980 | Cox et al. | 324/102 |
| 5,483,170 | 1/1996 | Beasley et al. | 324/522 |

*Primary Examiner*—Albert W. Paladini
*Attorney, Agent, or Firm*—Pravel, Hewitt & Kimball

[57] ABSTRACT

A computer controllable testing and monitoring station forms short-term intervals of simulated alternating current power level disturbance, either undervoltage (sag) or overvoltage (swell). The station forms the short term voltage sags or swells so that their effects on sensitive equipment can be measured. The starting point of the sag or swell disturbance, as well as the time duration of the disturbance, can be accurately controlled.

18 Claims, 5 Drawing Sheets

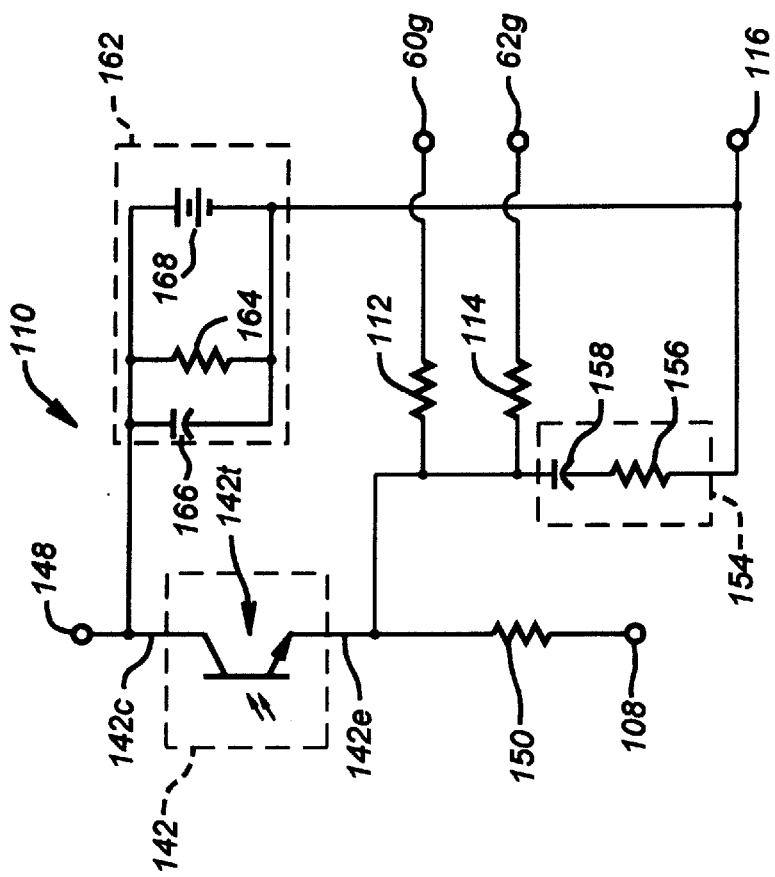
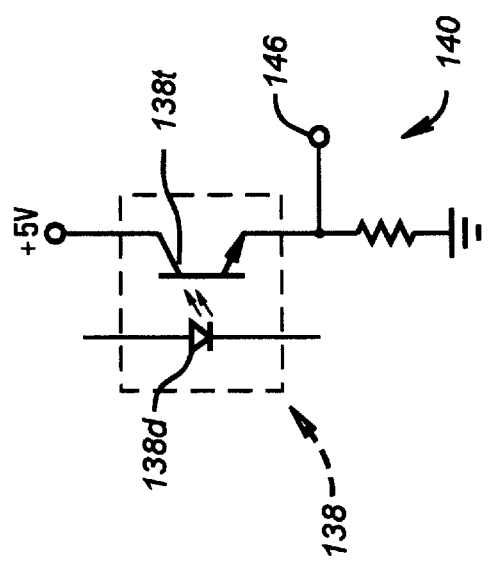
FIG. 6
FIG. 5

VOLTAGE SAG/SWELL TESTING STATION

BACKGROUND OF INVENTION

1. Field of Invention:

The present invention relates to testing and monitoring stations for alternating current power level disturbances.

2. Description of Prior Art:

There has in recent years been a significant growth in the use of electrical equipment of types which are generally termed sensitive loads. An item of electrical equipment considered as a sensitive load is one which would have its performance affected by power disturbances. The most common disturbances encountered have been variations in the level of alternating current power the load received as a source of energy. A common example of a sensitive load is a digital computer, although there are a wide variety of other types known. It has become a common practice to use power line conditioners to afford some measure of protection to sensitive loads.

It is known that at times there occur in power distribution networks disturbances in the level of alternating current power. They are frequently referred to as voltage sags when the alternating current power line voltage drops below its rated or specified level. Conversely, disturbances where the line voltage exceeds its rated or specified level have been referred to as voltage swells.

It has become important to measure and determine the sensitivity of power system loads, as well as the capabilities of their associated power line conditioners, in the presence of power line disturbances such as voltage sags and swells. So far as is known, presently available testers for power line disturbances have not been satisfactory because of lack of an ability to control the time at which the disturbance started, and the time when it stopped, with accuracy.

SUMMARY OF INVENTION

Briefly, the present invention provides a new and improved apparatus for testing the response of a sensitive electrical load to disturbances in alternating current power furnished to the load. A source of alternating current power is provided for operating the load under normal service conditions. A power adjuster is provided for causing a disturbance in the alternating current power from the source. A switching circuit selectively connects the load to either the source or the power adjuster according to test requirements. A computer controls the operation of the switching circuit and also forms records of the responses of the sensitive load when disturbances in the power occur.

In the preferred embodiment, the power adjuster causes a disturbance in the magnitude or amplitude of the voltage of the alternating current power from the source. The voltage disturbance may be either a voltage sag or a voltage swell, depending on test requirements. The onset or start and the duration of the power disturbance are precisely controllable by the computer and the switching circuit.

BRIEF DESCRIPTION OF THE DRAWINGS

FIG. 5 is a schematic electrical circuit diagram of a trigger circuit in the test station of FIG. 4.

FIG. 6 is a schematic electrical circuit diagram of a gate drive control circuit in the test station of FIG. 1.

Figure 1:
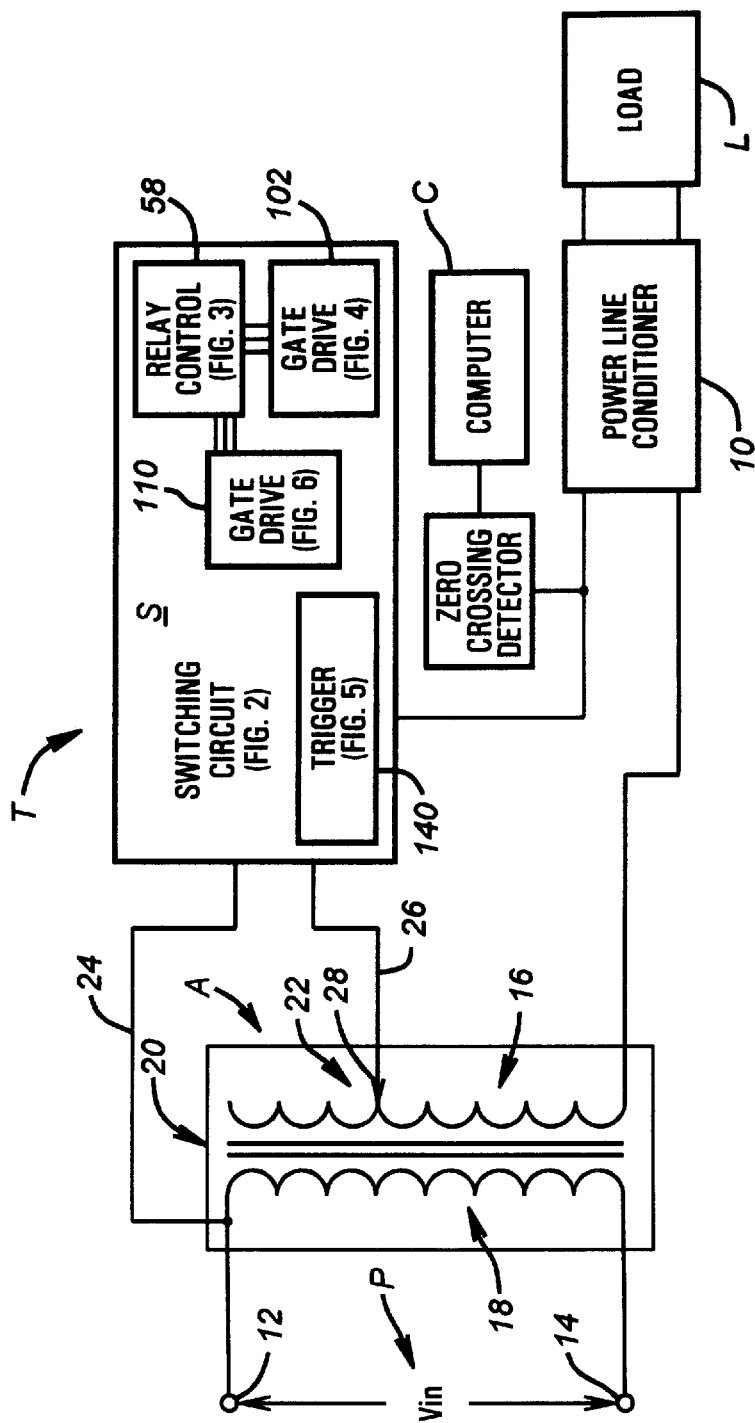
FIG. 1 is a schematic electrical circuit diagram of a test station according to the present invention.

DESCRIPTION OF THE PREFERRED EMBODIMENT:

In the drawings, a voltage sag/swell testing station T is shown (FIG. 1) which is controlled and monitored by a computer C. The test station T is connected to a power source P of conventional alternating current power and provides the capability to conduct precision sag/swell tests on a sensitive load L. As used in the present invention, and as is known in the art, a sensitive load is one which would have its performance affected by power disturbances. A common example of a sensitive load is a digital computer, although there are a wide variety of other known types of sensitive loads.

As will be set forth below, the voltage sag and voltage swell formed in the test station T are disturbances in the magnitude of the voltage of the alternating current power from the source which are provided to the sensitive load L. These tests can be conducted with a test time duration as short as one degree of one 360° cycle of 60 Hz power, or as long as tens of cycles of 60 Hz power. The starting and stopping times of the voltage disturbance are controllable in a switching circuit S responsive to the computer C to within one degree of timing accuracy. The magnitude of the voltage disturbances, whether sag or swell, are also controlled by a voltage adjuster A, as will be set forth below. Further, in addition to controlling the duration of the tests, the computer C collects the voltage and current waveforms prior to and during the tests and displays and stores these waveforms.

Depending upon the particular test parameters under consideration for the load L, a power line conditioner 10 may be connected between the power source P and the load L. The testing station T is used to determine the sensitivity of the load L, as well as the capabilities of an optional power line conditioner 10 to protect the load L when subjected to various types of voltage disturbances, usually voltage sags or swells.

For example, the test station T permits monitoring and testing of the susceptibility of the load L to voltage sags and swells; the capability of the load L to ride through or continue satisfactory performance in these conditions; the time duration that such a load can satisfactorily operate during intervals of voltage sags or swells; and the protection capabilities of the power line conditioner 10 under test to protect the load L in conditions of voltage disturbances.

The power source P is typically a conventional alternating current wall power outlet at, for example, 120 volts to input terminals 12 and 14 of a variable autotransformer or variac 16. A primary coil 18 of the auto transformer 16 is connected to the input terminals 12 and 14 and electromagnetically linked through a core 20 to secondary coil 22 of the auto transformer 16.

A bypass conductor 24 electrically connects the switching circuit S to the input terminal 12 of the power source P. The switching circuit S is also connected through a conductor 26 to a tap 28 on the secondary coil 22 of the auto transformer 16. The magnitude of the voltage available on the conductor 26 through the switching circuit S is adjustable by moving the tap 28 according to the desired voltage level.

The switching circuit S can produce a voltage disturbance in the form of either a sag or swell by switching the connection from the normal wall power available through the switching circuit S to a reduced level (or sag) or an increased level (or swell). As will be set forth, this is done by switching from conductor 24 to the reduced or increased voltage level present at conductor 26 from the transformer tap 28, according to test requirements. Further, as will be set forth, the switching circuit S can reverse switching and re-connect the load L back to the conventional power available through the power source P. The switching functions can be accomplished at desired points on the voltage waveform by the computer C monitoring the zero-crossing of the waveform with a zero crossing detector as shown in the drawings.

Figure 2:
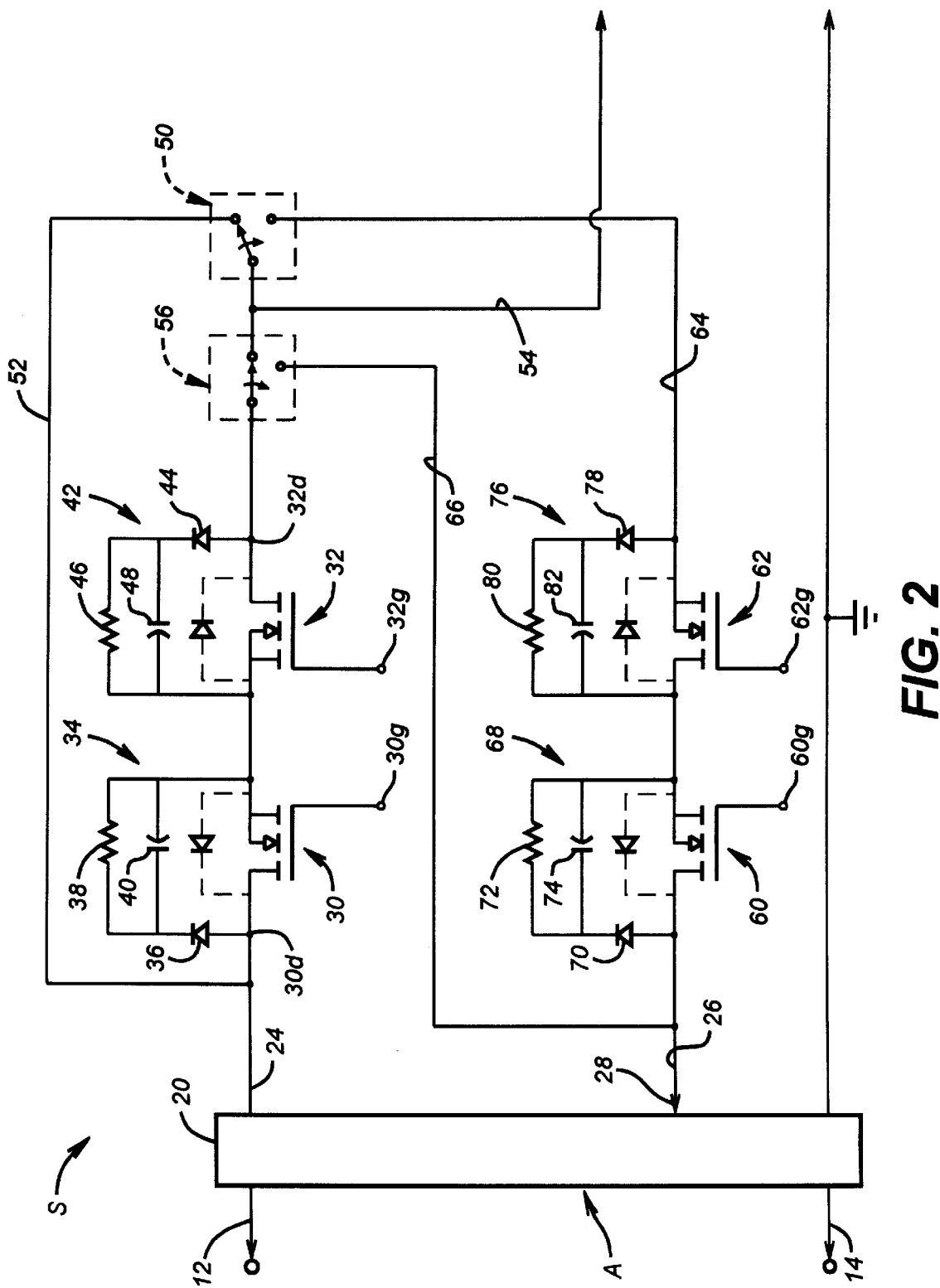
FIG. 2 is a schematic electrical circuit diagram of a switching circuit in the test station of FIG. 1.

Considering the switching circuit S (FIG. 2) more in detail, a series-connected pair of switching transistors 30 and 32 are connected to the power source P through the conductor 24. The switching transistors 30 and 32 are preferably MOSFETs, although it should be understood that other types of transistors could be used depending upon the particular requirements. A surge protective or snubbing circuit 34 is electrically connected across the switching transistor 30 to protect against switching transient current surges. The snubbing circuit 34 includes a diode 36, and a resistor 38 in parallel with a surge damping or snubbing capacitor 40 Similarly, a surge protective or snubbing circuit 42 including a diode 44, a parallel connected resistor 46 and surge damping or snubbing capacitor 48 is connected across the switching transistor 32 for transient current protection purposes.

Figure 3:
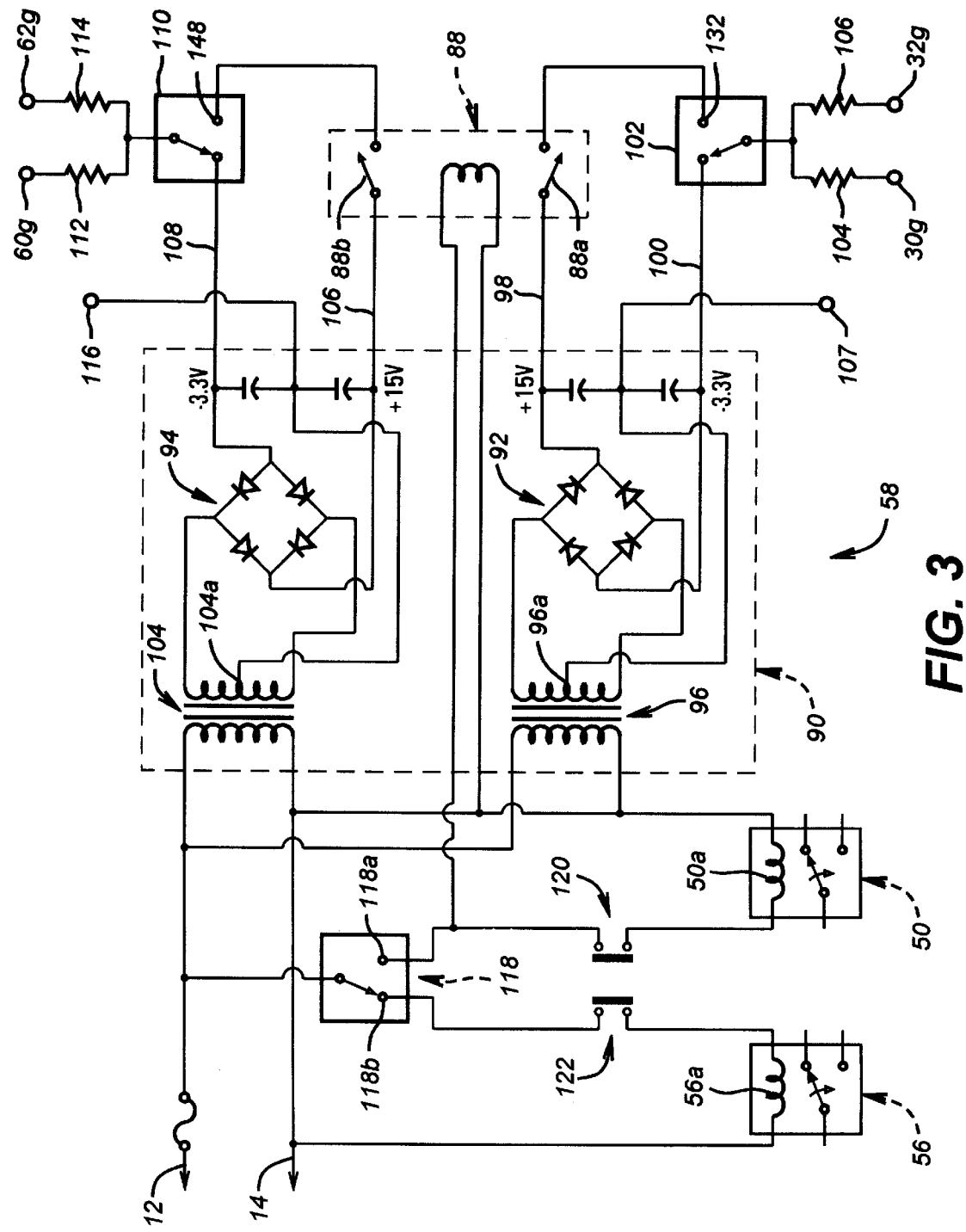
FIG. 3 is a schematic electrical circuit diagram of a relay control circuit in the test station of FIG. 1.

A master on-off control or bypass switch 50 is electrically connected by conductor 52 to the power supply conductor 24. When the master switch 50 is in the position indicated in the drawings, power from the power source P is provided from the conductor 52 through a conductor 54 to the load L and conditioner 10. A test conditioner relay contact 56 is electrically connected between the switching transistors 30 and 32 and the control switch 50. The relays 50 and 56 operate under control of a relay control circuit 58 (FIGS. 1 and 3). Relay 56 is used to pre-charge the surge damping capacitors 40 and 48 (FIG. 2) prior to activation of the switching circuit S for testing purposes. This is done to prevent voltage distortion in the waveforms due to capacitor inrush currents, as will be set forth below.

The switching circuit S also includes series-connected switching transistors 60 and 62 which are electrically connected to the tap 28 of the auto- transformer 16. Transistors 60 and 62 connect autotransformer 16 through conductor 26 over a conductor 64 to the switch 50 and load conductor 54. The switching transistor 60 is also electrically connected over a conductor 66 to the switching relay 56. A surge dampening or protective circuit 68 includes a diode 70, a resistor 72 and a surge-dampening or snubber capacitor 74 electrically connected across the terminals of the switching transistor 60. The protective circuit 68 functions in a like manner to the protective circuits 34 and 42 for the switching conductors 30 and 32, respectively. In a like manner, a surge protection or damping circuit 76 including a diode 78, resistor 80 and capacitor 82 are electrically connected for transient protection purposes across the terminals of the switching conductor 62.

The function of the surge-dampening or protective circuits 34, 42, 68 and 76 is to produce relatively transient-free or clean voltage sags. This is done by absorbing any inductive energies of interrupted currents caused during switching of the switching circuit S and interrupting currents therethrough. For example, in the event transistors 30 and 32 are switched to an open or non-conductive state while furnishing current to the load L, inductive forces tend to keep this current flowing. In this event, voltage at a drain terminal 30d of transistor 30 increases and forward biases the diode 36. Any current then flowing in conductor 24 thus has an available path through the diode 36 and capacitor 40 and any internal source-drain diode effect in the transistor 32 which is still reverse-biased. When, however, capacitor 40 comes fully charged by absorbing the inductive energy, the diode 36 becomes reverse-biased, in effect trapping the energy in capacitor 40 so that energy cannot escape and cause ringing. The resistor 38 then slowly permits discharge or dissipation of the energy stored in the capacitor 40.

During opposite half-cycles of alternating current flow, when the transistor 32 is conducting current from conductor 54 to conductor 24, a similar process occurs. Diode 44 becomes forward biased in the event of transistor 32 switching open, providing a current path at a drain terminal 32d through diode 44 and capacitor 48 and the internal source-drain diode of transistor 30 as indicated schematically. This current flow continues until capacitor 48 has become fully charged and absorbed the inductive energy. At this time, the diode 44 is reverse-biased, containing the energy in capacitor 48 so that such energy cannot escape into the circuit to cause ringing. Resistor 46 then permits slow dissipation or discharge of the energy stored in the capacitor 48.

In the protective circuits 34 and 42, their respective diodes 36 and 44 insure that inductive energy present in the current when interrupted is thus trapped, preventing such energy from reacting with the remaining portions of the circuit and causing ringing. Further, the use of small, relatively inexpensive polarized capacitors is permitted, rather than more costly alternating current capacitors.

In a like manner, the diode 70 and 78 of the protective circuits 68 and 76, respectively, together with their associated resistors 72 and 80, and capacitors 74 and 82 function whenever current from the auto transformer 16 through the switching transistors 60 and 62 to the conductor 54 is interrupted.

In the switching circuit S, the voltage sag or swell produced for use during a test is caused when the computer C causes the switching transistors 30 and 32 to be switched off at their gate terminals 30g and 32g. Concurrently, the switching transistors 60 and 62 are switched on at their gates 60g and 62g. As a result of this switching action, the load L is connected over the conductor 54 through the conductor 64 to the tap 28 of the auto transformer by conductor 26. Conversely, when switching transistors 30 and 32 are conducting and transistors 60 and 62 are turned off, the load L is connected to the conventional power from the power source P by the conductor 24 through the switch 56.

The switch 56 is used to charge the protective capacitors 74 and 82 before a test and is then de-energized during the test. The on-off or master control switch 50 is used to supply power directly from the conductor 24 either before or after tests, by in effect bypassing the switching transistors 30 and 32. During a test, the switch 50 is reversed in position from that shown in the drawings, forcing the switching transistors 30 and 32 to supply the load until the switching transistors 60 and 62 are activated.

The relay 50 thus supplies load power directly from the power source P during all times when testing operations are not occurring. This protects the switching transistors in the switching circuit S from having to carry full load current for extended periods of time. It allows them to function only as needed to switch the load from the normal supply from the power source P to the lower voltage sag level or higher swell level and back during testing operations.

When the switch 50 is in the position shown in the drawings (FIG. 2), the switching transistors 30 and 32 are short-circuited and current flows directly through conductors 52 and 54 to the load L. With switch 50 in the position shown, the autotransformer tap 28 and switching transistors 60 and 62 as well are disconnected from the load 10. When testing conditions are to begin, the on-off control switch 50 is activated by the relay control circuit 58, switch 50 changes position and removes any short circuit across the set of switching transistors 30 and 32. At the same time, the set of switching transistors 60 and 62 also become capable of connection to the load circuit L.

The computer C sends control signals which determine the set of switching transistors which are to be conductive. Each of the switching transistors 30, 32, 60, and 62 are controlled by light pulse signals from the computer C formed in relay control circuit 58 in a manner set forth below. In the condition in effect immediately after the switch 50 is energized, and in the absence of an active or "high" signal at gate terminals 30g and 32g, transistors 30 and 32 are conductive, while transistors 60 and 62 are off. This connects the load L to the full rated power from the power source P.

When control signals from the computer C are provided to gate terminals 30g and 32g, transistors 30 and 32 are switched off. Transistors 60 and 62 are caused to conduct at this time by signals at their gate terminals 60g and 62g, connecting the load 10 to the tap 28 of the auto transformer 16. It is to be noted that this switching action can occur only when the master on-off switch 50 is energized and moved to an alternate position from that shown in the drawing. If the on-off switch is otherwise de-energized, supply from the power source P through the conductors 24, 52, and 54 is available without regard to the conductive status of the switching transistors in the switching circuit S.

The relay contact 56 is used to provide an advanced charge to the capacitors 40 and 48, preventing any voltage distortion due to capacitor inrush current. Immediately before any test, transistors 30 and 32 are conductive, and thus capacitors 40 and 48 are discharged. As soon as it is desirable to cause a voltage sag, and transistors 30 and 32 are rendered non-conductive or open, a voltage is presented to them. Such a voltage represents the full difference between the power from the power source P over conductor 24 and the voltage present at the tap 28 of the auto transformer 16. Because the capacitors 40 and 48 are initially discharged, they receive a large inrush of current for the initial positive and negative half-cycles of alternating current, resulting in a distortion of the load voltage wave form.

By activating the switch 56 immediately before any such test, the capacitors 40 and 48 can be charged in advance before a test begins to prevent this waveform distortion condition from occurring. It is to be noted that a separate pre-charging function is not necessary for capacitors 74 and 82. Pre-charging occurs automatically due to the switching transistors 30 and 32 being conductive, and switching transistors 60 and 62 being non-conductive immediately after energization of the relay contact 50. Because of this, capacitors 74 and 82 due to their circuit connection automatically pre-charge to prevent any voltage distortion from capacitor inrush currents. The impedance parameters of the protective circuits 34, 42, 68 and 76 are preferably identical, and are chosen so that the R-C time constant is on the order of thirty seconds or more, providing a comfortable margin for this pre-charging protective function.

Operation of the relays 50 and 56 of the switching circuit S is controlled by the relay control circuit 58 (FIG. 3). The relay control circuit 58 also includes a power supply control relay 88 which arms the switching transistors 30, 32, 60, and 62 so that the transistors 30, 32, 60, and 62 can be turned on by the switching circuit S. As long as the relay 88 is open, neither of the transistors 30, 32, 60 nor 62 can be switched on. However, when the relay 88 is closed, the transistors 30, 32, 60, and 62 are armed and switching circuit S is ready to operate.

Considering the relay control circuit 58 more in detail, a power supply circuit 90 includes a pair of diode rectifier bridges 92 and 94. The diode bridge 92 is electrically connected through a transformer 96 to the input voltage terminals 12 and 14 to provide positive direct current operating power or bias. This positive bias or power is furnished at a positive power supply output 98 to the power supply control relay 88.

Figure 4:
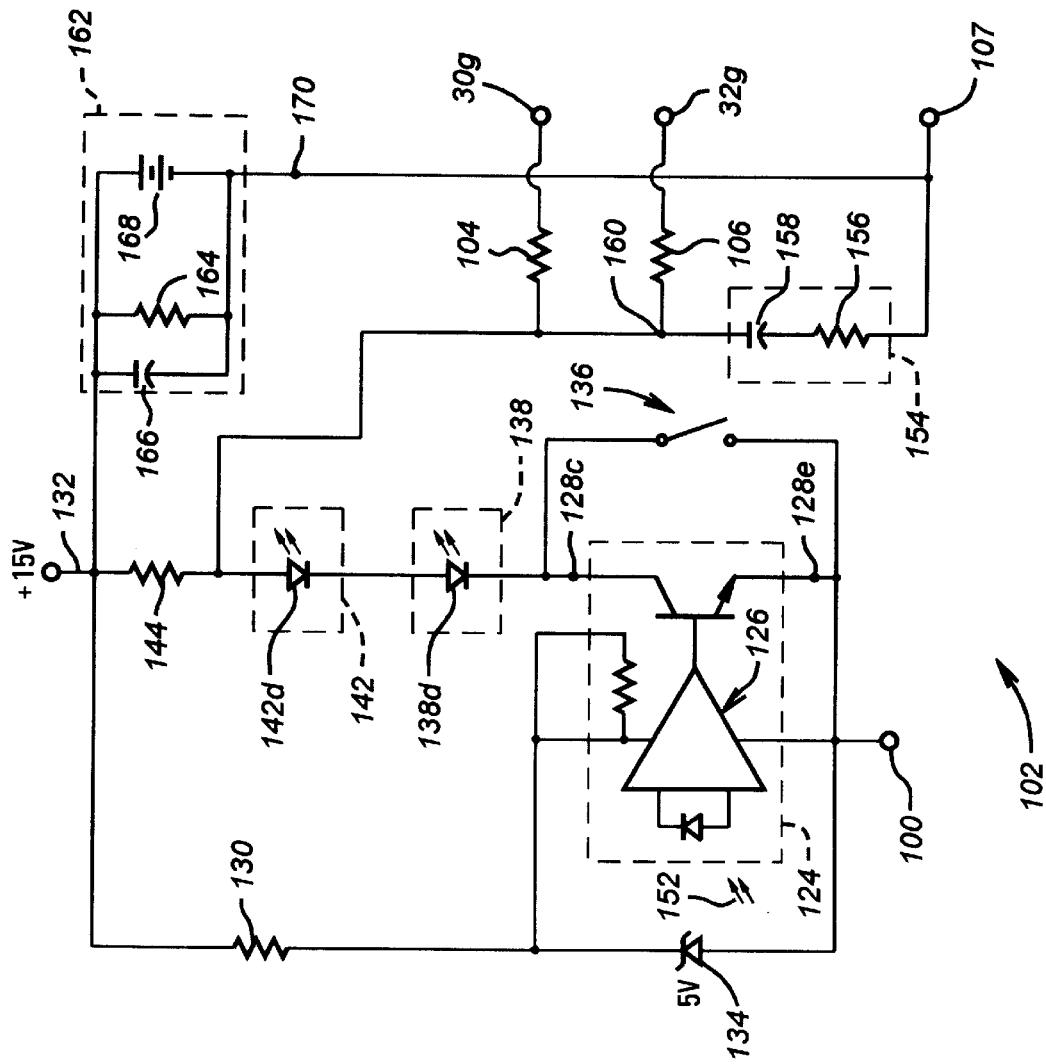
FIG. 4 is a schematic electrical circuit diagram of a gate drive circuit in the test station of FIG. 1.

Diode bridge 92 also provides negative direct current operating power or bias at an output terminal 100 to a gate drive control circuit 102 (FIG. 4). The gate drive control circuit 102 is connected through a resistor 104 to the gate terminal 30g of the transistor 30 in the switching circuit S. Similarly, the gate drive control circuit 102 is also connected through a resistor 106 to the gate terminal 32g of the transistor 32 in the switching circuit S. A center tap terminal 96a of the secondary of the transformer 96 is electrically connected at an output terminal 107 to the gate drive control circuit 102.

The diode bridge 94 is electrically connected through a transformer 104 to the input voltage terminals 12 and 14 in opposite polarity to the transformer 96. Diode bridge 94 is connected to provide positive direct current operating power or bias at a positive power supply output 106 to the power supply control relay 88, and also to provide negative direct current operating power or bias at an output terminal 108 to a gate drive control circuit 110. The gate drive control circuit 110 is connected through a resistor 112 to the gate terminal 60g of the transistor 60 in the switching circuit S. The gate drive control circuit 110 is also connected through a resistor 114 to the gate terminal 62g of the transistor 62 in the switching control circuit S. A center tap terminal 104a of the secondary of the transformer 104 is electrically connected at an output terminal 116 to the gate drive control circuit 110.

The relay control circuit 58 also includes a toggle switch 118 which can alternatively electrically connect either the relay 50 or the relay 56 to receive power from input alternating current power supply terminals 12 and 14. A coil 50a of the relay 50 is electrically connected through a normally open push-button switch 120 to a terminal 118a of the switch 118. A coil 56a of the relay 56 is electrically connected through a normally open push-button switch 122 to a terminal 118b of the switch 118.

The switch 118 is normally in contact at terminal 118b in the position shown in the drawings when the load L is under normal operating load conditions receiving operating alternating current power. In this manner, coil 50a of relay 50 does not receive power. Similarly, power supply control relay 88 is also disconnected from operating power. With the switch 118 in this position, the switch 122 can be depressed to energize relay coil 56a to begin charging of capacitors 40 and 48 in the switching circuit S in the manner set forth above. The switch 118 can thereafter be moved into contact with the terminal 118a so that the switch 120 can be depressed, furnishing power to coil 50a of the relay so that load switching can occur, in the manner set forth above.

In the gate drive control circuit 102 (FIG. 4), an optical receiver 124 includes an optical receiver operational amplifier 126 having a transistor 128 electrically connected in common to negative operating bias potential at the negative bias output terminal 100 of the power supply 90. The operational amplifier 126 is also electrically connected as indicated through a resistor 130 to a positive operating bias at a terminal 132. Terminal 132 is electrically connected through a normally open contact 88a (FIG. 3) of the relay 88 to the positive bias output terminal 98 of the power supply 90. A voltage regulating Zener diode 134 (FIG. 4) is electrically connected to the resistor 130 and also across the bias terminals of the operational amplifier 124. A toggle control switch 136 is electrically connected across a collector terminal 128c and an emitter terminal 128e of the output transistor 128 of the optical receiver 124.

A snubber circuit 154, comprising a resistor 156 and a capacitor 158 electrically connected in series, protects the transistor 128 from any unwanted switching transients. The resistor 156 is electrically connected to terminal 100 and output terminal 107 and the capacitor 158 is electrically connected to a resistor 106 at node 160. A noise filter circuit 162 is also provided, electrically connected through node 170 to output terminal 107. The circuit 162 is further electrically connected through node 172 to the resistor 144 and to the +15 V DC voltage 132. The noise filter circuit 162 is composed of a resistor 164, a capacitor 166, and 15 volt voltage source 168, each electrically connected in parallel. Filter circuit 162 is furnished to eliminate unwanted electrical noise from the 15 V DC voltage 132.

In the gate drive control circuit 102 (FIG. 4), an optical receiver 124 includes an optical receiver operational amplifier 126 having a transistor 128 electrically connected in common to negative operating bias potential at the negative bias output terminal 100 of the power supply 90. The operational amplifier 126 is also electrically connected as indicated through a resistor 130 to a positive operating bias at a terminal 132. Terminal 132 is electrically connected through a normally open contact 88a (FIG. 3) of the relay 88 to the positive bias output terminal 98 of the power supply 90. A voltage regulating Zener diode 134 (FIG. 4) is electrically connected to the resistor 130 and also across the bias terminals of the operational amplifier 124. A toggle control switch 136 is electrically connected across a collector terminal 128c and an emitter terminal 128e of the output transistor 128 of the optical receiver 124.

A light-emitting diode 138d of an optoisolator 138 (FIGS. 4 and 5) in an oscilloscope trigger circuit 140 (FIG. 5) and a light-emitting diode 142d of an optoisolator 142 (FIGS. 4 and 6) of the gate drive control circuit 110 (FIGS. 3 and 6) are electrically connected in series between the collector 128c (FIG. 4 )of the transistor 128 and a resistor 144. The resistor 144 is connected at an opposite terminal from the optoisolator 142 to the operating bias terminal 132. The connection of the optoisolator 142 and the resistor 144 is also electrically connected through the resistor 104 to the gate terminal 30g of the switching transistor 30 (FIG. 2) and through the resistor 106 to the gate terminal 32g of the switching transistor 32 (FIG. 2) in the switching circuit S.

In the gate drive control circuit 102, in the absence of an optical signal to activate the optical receiver 124, the transistor 128 at the output of operational amplifier 126 is non-conductive. Consequently, the gate voltages at terminals 30g and 32g of the transistors 30 and 32, respectively, are pulled to the +15 V voltage bias at terminal 132 by the resistor 144. However, when an optical activation signal is received at the optical input of the operational amplifier 126, the transistor 128 is rendered conductive. When transistor 128 is conductive, current is drawn through the light-emitting diodes 138d and 142d of the optoisolators 138 and 142. Additionally, when the transistor 128 is rendered conductive, the gate voltages at terminals 30g and 32g are pulled to the negative operating potential of −3.3 V and switching transistors 30 and 32 are not conductive.

The switch 136 is provided in the gate drive control circuit 102 for the transistors 30 and 32 to allow a manual override. Such an override accomplishes the same function as occurs when the transistor 128 is rendered conductive on the receipt of light in the optical receiver 124. This allows manual control of switching in the switching circuit S, when desired. In a closed position, the switch 136 overrides any optical signal received by the optical receiver 124.

When the switch 136 is open, switching transistors 30 and 32 are conductive and operate in the manner set forth above unless and until the optical receiver 124 receives an activating signal. In such an event, the override function of the open toggle switch 136 is precluded and any potential control it has over the switching circuit S is replaced by the transistor 128. Conversely, when the switch 136 is closed, the switching transistors 30 and 32 are turned off and are not conductive. This in turn and renders conductive the switching transistors 60 and 62, allowing the creation of a sag or swell in the voltage furnished to the load L.

The oscilloscope trigger circuit 140 (FIG. 5) includes the optical-isolator 138 including the light-emitting diode 138d and a transistor 138t which is conductive in response to receipt of light by the diode 138d. When the transistor 138t is conductive, an output signal is provided at a scope trigger terminal 146. The oscilloscope trigger circuit 140 is provided as a calibration or inspection mechanism, for furnishing signals to an oscilloscope or monitor. Under normal operation of the present invention, all data is directly collected by the computer C.

Considering the gate drive control circuit 110 (FIG. 6), a transistor 142t of the optoisolator 142 is electrically connected at an emitter terminal 142e through a resistor 150 to the negative operating bias potential at the negative bias output terminal 108 of the power supply 90. A collector terminal 142c of the transistor 142t is electrically connected to a positive operating bias at a terminal 148. Terminal 148 is also electrically connected through a normally open contact 88b (FIG. 3) of the relay 88 to the positive bias output terminal 106 of the power supply 90. The emitter 142e of the transistor 142t is also electrically connected through the resistor 112 to the gate terminal 60g of the switching transistor 60 (FIG. 2) and through the resistor 114 to the gate terminal 62g of the switching transistor 62.

The gate drive control circuit 110 is driven by the light-emitting diode 142d of the optoisolator in the gate drive control circuit 102 (FIG. 4). When current flows through the light emitting diode 142d, as is to be the case during a sag or swell, the transistor 142t is conductive and pulls the gate voltages at terminals 60g and 62g to the +15 volts present at terminal 148. Conversely, when there is to be no sag or swell to be formed, the transistor 142t is non-conductive and thus the gate terminals 60g and 62g are held at the −3.3 V volts present at the terminal 108 through resistor 150.

In the operation of the present invention, the particular type of voltage disturbance, whether sag or swell, and its magnitude, as well as its onset time and duration are specified by a user through the computer C in the conventional manner. The switching transistors 30 and 32 are activated through the gate drive control circuit 102 on receipt of a light impulse at optical receiver 124 from the computer C indicated schematically at 152. In the absence of such a light pulse signal, switching transistors 30 and 32 are conductive, and switching transistors 60 and 62 are non-conductive, thus connecting the load L via the conductor 24 to the normal full operating voltage across the input terminal 12 and 14. When the optical receiver 124 in the gate drive control circuit 102 receives an optical control signal from the computer C, switching transistors 30 and 32 are turned off at their gate terminals 30g and 32g by gate drive control circuit 102. Concurrently, switching transistors 60 and 62 are activated by gate drive control circuit 110 at their gate terminals 60g and 62g, connecting the load L to the tap 28 of the autotransformer 22 through the switching circuit S. It is to be noted that load switching can only occur through the switching circuit S while the relay 50 is energized by the pushbutton switch 120. In the event that the relay 50 is de-energized, the load L is automatically directly connected via conductor 52 to the wall outlet terminals over the conductor 24 regardless of the status of the switching transistors 30, 32, 60 and 62.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. An apparatus for testing the response of a sensitive electrical load to disturbances in alternating current power furnished to the load, comprising:

a source of alternating current power for providing a normal power output for operating the load;

a power adjuster for causing a disturbance in the normal alternating current power output from said source and providing an output simulating a power disturbance for application to the load during a test; and a switching circuit for selectively connecting the load to receive the normal output of said source or the output from said power adjuster containing the power disturbance according to test requirements.

2. The apparatus of claim 1, further including:

a control switch for by-passing said switching circuit and connecting the load to said source.

3. The apparatus of claim 1, wherein said power adjuster causes a disturbance in the magnitude of the voltage of the alternating current power from said source.

4. The apparatus of claim 3, wherein said power adjuster causes voltage sags in the voltage from said source.

5. The apparatus of claim 3, wherein said power adjuster causes voltage swells in the voltage from said source.

6. The apparatus of claim 1, wherein said switching circuit comprises:

a first switching transistor set selectively activated prior to the test; and a second switching transistor set selectively activated at the start of the test.

7. The apparatus of claim 6, further including:

a surge damping circuit connected with said first switching transistor set for protection against switching transients.

8. The apparatus of claim 6, further including:

a surge damping circuit connected with said second switching transistor set for protection against switching transients.

9. The apparatus of claim 6, wherein said switching circuit comprises:

a gate control circuit for activating said first switching transistor means to connect the load to said source.

10. The apparatus of claim 1, further including:

a computer for controlling the operation timing of said switching circuit.

11. The apparatus of claim 10, further including:

an interface connecting said computer to said switching circuit.

12. The apparatus of claim 10, wherein said computer is connectable to the load for forming records of load responses to power disturbances applied thereto.

13. The apparatus of claim 11, wherein said interface comprises:

an optical isolator circuit transferring signals from said computer to said switching circuit.

14. The apparatus of claim 11, further including:

a by-pass switch for inhibiting operation of said interface.

15. The apparatus of claim 1, further including:

a computer for controlling the operation of said switching circuit;

an optical isolator circuit transferring signals from said computer to said switching circuit.

16. The apparatus of claim 15, wherein said switching circuit comprises:

a first switching transistor set selectively activated prior to the test; and a second switching transistor set selectively activated at the start of the test.

17. The apparatus of claim 16, wherein said switching circuit further includes:

means for enabling said second switching transistor set when said second switching transistor set is deactivated.

18. The apparatus of claim 7, further including:

an optical isolator circuit transferring signals from said first gate control circuit to said second gate control circuit.

* * * * *